United States Patent
Chen et al.

(10) Patent No.: US 11,005,081 B2
(45) Date of Patent: May 11, 2021

(54) COATING METHOD, DISPLAY SUBSTRATE AND MANUFACTURING METHOD THEREOF, AND DISPLAY DEVICE

(71) Applicant: BOE Technology Group Co., Ltd., Beijing (CN)

(72) Inventors: Yuju Chen, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/446,722

(22) Filed: Jun. 20, 2019

(65) Prior Publication Data

US 2020/0006711 A1 Jan. 2, 2020

(30) Foreign Application Priority Data

Jul. 2, 2018 (CN) .......................... 201810708937.2

(51) Int. Cl.
*H01L 51/56* (2006.01)
*H01L 27/32* (2006.01)
*H01L 51/00* (2006.01)
*H01L 51/50* (2006.01)

(52) U.S. Cl.
CPC .......... *H01L 51/56* (2013.01); *H01L 27/3244* (2013.01); *H01L 51/0003* (2013.01); *H01L 51/5012* (2013.01); *H01L 51/5056* (2013.01); *H01L 51/5072* (2013.01); *H01L 51/5088* (2013.01); *H01L 51/5092* (2013.01)

(58) Field of Classification Search
None
See application file for complete search history.

(56) References Cited

U.S. PATENT DOCUMENTS

| | | | |
|---|---|---|---|
| 2004/0140759 A1* | 7/2004 | Park | H01L 27/3283 313/504 |
| 2005/0158523 A1* | 7/2005 | Gupta | H01L 51/0004 428/195.1 |
| 2007/0163647 A1* | 7/2007 | Liu | B01L 3/0241 137/1 |
| 2016/0126417 A1* | 5/2016 | Ray | H01L 33/60 257/40 |

* cited by examiner

*Primary Examiner* — Asok K Sarkar
(74) *Attorney, Agent, or Firm* — Fay Sharpe LLP

(57) ABSTRACT

Provided are a coating method, a display substrate and a manufacturing method thereof, and a display device. The coating method includes: forming a micro-fluid channel on a first surface of a first substrate, wherein the first surface is a surface to be coated of the first substrate, and a sidewall of the micro-fluid channel is the first surface of the first substrate; immersing one end of the micro-fluid channel into ink, to enable the ink to fill the micro-fluid channel; and drying the ink filling the micro-fluid channel to form a thin film on the first surface of the first substrate. The present disclosure can help implement uniform film formation of a quantum dot light-emitting layer at a high resolution, reduce the process difficulty of a high-resolution product and improve the device performance and the display performance.

18 Claims, 7 Drawing Sheets

COATING METHOD, DISPLAY SUBSTRATE AND MANUFACTURING METHOD THEREOF, AND DISPLAY DEVICE

CROSS-REFERENCE TO RELATED APPLICATION

This application claims priority to Chinese Patent Application No. 201810708937.2, filed on Jul. 2, 2018 and entitled "Manufacturing Method of Display Substrate, and Display Device", the entire contents of which are incorporated herein by reference.

TECHNICAL FIELD

The present disclosure relates to the field of manufacture of display devices, and more particularly to a coating method, a display substrate and a manufacturing method thereof, and a display device.

BACKGROUND

A Quantum Dot Light Emitting Diode (QLED) is an emerging display device. Compared with other types of display devices, the QLED has the main characteristics of unique quantum size effect, macroscopic quantum tunneling effect, and surface effect, etc., as it adopts quantum dots having more excellent performance and made from a more stable material as the light-emitting material. Thereby, the QLED presents excellent physical properties, especially excellent optical properties, such as narrow emission spectrum, high light color purity, high light-emitting efficiency, tunable light color, favorable light-emitting stability, etc. Thus, a QLED display product has the merit of low power consumption, a long service life, high color purity, favorable stability, etc., and therefore has a broad development prospect.

SUMMARY

The present disclosure provides a coating method, a display substrate and a manufacturing method thereof, and a display device.

At least one embodiment of the present disclosure provides a coating method, comprising: forming a micro-fluid channel on a first surface of a first substrate, wherein the first surface is a surface to be coated of the first substrate, and a sidewall of the micro-fluid channel is the first surface of the first substrate; immersing one end of the micro-fluid channel into ink to enable the ink to fill the micro-fluid channel; and drying the ink that filling the micro-fluid channel to form a thin film on the first surface of the first substrate.

Optionally, forming the micro-fluid channel on the first surface of the first substrate comprises: forming a barrier layer on the first surface, wherein the barrier layer comprises at least two spaced barrier strips extending in the same direction; and pressing a second substrate on the barrier layer to form a micro-fluid channel between adjacent two of the barrier strips.

Optionally, after forming the barrier layer on the first surface and prior to pressing the second substrate on the barrier layer, the method further comprises: performing surface treatment on the barrier layer to enable top surfaces of the at least two barrier strips to be flat surfaces within a same plane.

Optionally, a surface which is pressed with the barrier layer, of the second substrate is configured as a hydrophobic surface.

Optionally, prior to immersing one end of the micro-fluid channel into the ink, the method further comprises: degassing the ink.

Optionally, after the ink fills the micro-fluid channel, the method further comprises: performing cross-linking treatment on the ink in the micro-fluid channel.

Optionally, after drying the ink filling the micro-fluid channel, the method further comprises: separating the first substrate from the second substrate.

Optionally, after separating the first substrate from the second substrate, the method further comprises: removing the barrier layer on the first substrate.

Optionally, the method further comprises: selectively etching the thin film after forming the thin film, to enable the thin film to have at least one of the following features of an expected thickness and an expected pattern.

At least one embodiment of the present disclosure provides a manufacturing method of a display substrate, comprising: manufacturing a first film layer of the display substrate in the following manner: providing a first substrate on which the first film layer is to be manufactured; forming a micro-fluid channel on a first surface of the first substrate, wherein the first surface is a surface on which the first film layer is to be manufactured, and a sidewall of the micro-fluid channel is the first surface of the first substrate; immersing one end of the micro-fluid channel into ink to enable the ink to fill the micro-fluid channel; and drying the ink filling the micro-fluid channel to form the first film layer on the first surface of the first substrate.

Optionally, forming the micro-fluid channel on the first surface of the first substrate comprises: forming a barrier layer on the first surface, wherein the barrier layer comprises at least two spaced barrier strips extending in the same direction; and pressing a second substrate on the barrier layer to form the micro-fluid channel between adjacent two of the barrier strips.

Optionally, after forming the barrier layer on the first surface and prior to pressing the second substrate on the barrier layer, the method further comprises: performing surface treatment on the barrier layer to enable top surfaces of the at least two barrier strips to be flat surfaces within a same plane.

Optionally, a surface which is pressed with the barrier layer, of the second substrate is configured as a hydrophobic surface.

Optionally, prior to immersing one end of the micro-fluid channel into the ink, the method further comprises: degassing the ink.

Optionally, after the ink fills the micro-fluid channel, the method further comprises: performing cross-linking treatment on the ink in the micro-fluid channel.

Optionally, the first substrate comprises a plurality of sub-pixel columns formed by arranging sub-pixel regions of a first color, and forming the barrier layer on the first surface comprises: forming a pattern including the at least two barrier strips on the first surface, to enable each of the sub-pixel regions of the first color to be between adjacent two of the barrier strips, and a region between every adjacent two of the sub-pixel columns is covered by one of the barrier strips respectively.

Optionally, providing the first substrate on which the first film layer is to be manufactured comprises: forming a pattern including a pixel electrode layer, wherein the pixel electrode layer comprises one pixel electrode in each of the sub-pixel regions of the first color.

Optionally, after drying the ink filling the micro-fluid channel, the method further comprises: separating the first substrate from the second substrate.

Optionally, after separating the first substrate from the second substrate, the method further comprises: removing the barrier layer on the first substrate.

Optionally, the method further comprises: selectively etching the first film layer after forming the first film layer, to enable the first film layer to have at least one of the following features of an expected thickness and an expected pattern.

Optionally, the display substrate is any one of a QLED display substrate and an OLED display substrate.

Optionally, the first film layer is any one of the following film layers in the display substrate: a hole injection layer, a hole transport layer, an electron transport layer, an electron injection layer, a red light-emitting layer, a green light-emitting layer and a blue light-emitting layer.

At least one embodiment of the present disclosure further provides a display substrate, wherein the display substrate is a display substrate manufactured by any one of the above methods of manufacturing a display substrate.

At least one embodiment of the present disclosure further provides a display device including a display substrate manufactured by any one of the above methods of manufacturing a display substrate.

DETAILED DESCRIPTION

To make the principles and advantages of the present disclosure clearer, the embodiments of the present disclosure will be described below in detail in conjunction with the accompanying drawings. It is obvious that the described embodiments are part rather than all of the embodiments of the present disclosure. All other embodiments obtained by those of ordinary skill in the art based on the embodiments of the present disclosure without creative work are within the scope of protection of the present disclosure. Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. The term "comprising" or a similar term means that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect.

In the related art, a QLED cannot be manufactured by a micro-molecule evaporation and patterning processes, and it is generally manufactured by a printing process. However, due to restriction of the structural design of a device and the performance of processing equipment, the printing process encounters a bottleneck in improvement of the film thickness uniformity and resolution.

Figure 1:
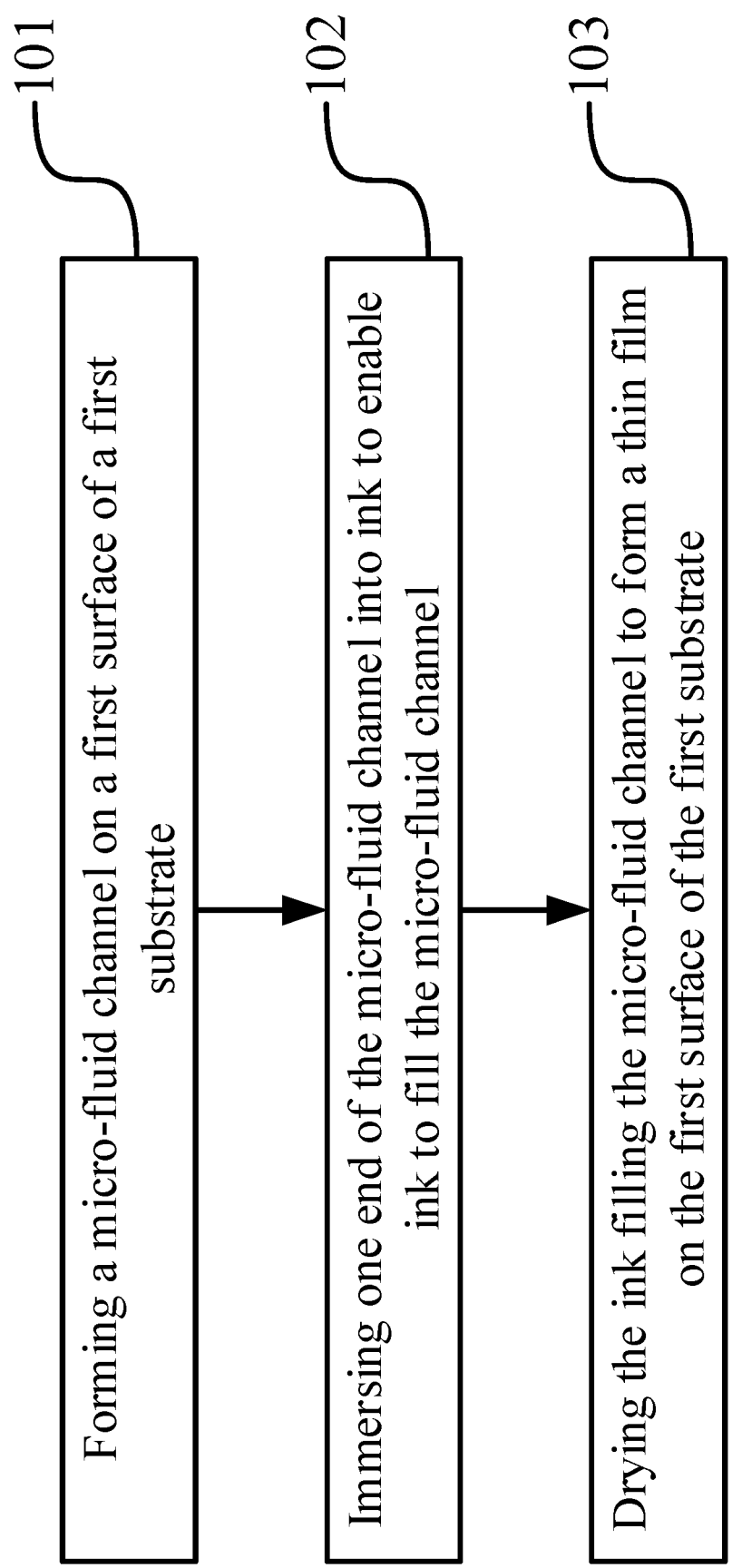
FIG. 1 is a flow chart showing a coating method according to an embodiment of the present disclosure.

FIG. 1 is a flow chart of a coating method according to an embodiment of the present disclosure. Referring to FIG. 1, the coating method includes the following steps.

In step 101, a micro-fluid channel is formed on a first surface of a first substrate.

The first surface is a surface to be coated of the first substrate. A sidewall of the micro-fluid channel is the first surface of the first substrate.

In step 102, one end of the micro-fluid channel is immersed into ink to enable the ink to fill the micro-fluid channel.

When one end of the micro-fluid channel is immersed into the ink, the ink with liquidity can fill the micro-fluid channel under the action of capillary force.

In step 103, the ink filling the micro-fluid channel is dried to form a thin film on the first surface of the first substrate.

It can be known from the above technical solution that the micro-fluid channel is formed on the first surface of the first substrate, and the thin film formed by filling and drying in the micro-fluid channel can be shaped based on the size and the volume of the micro-fluid channel. Thus, high-accuracy coating can be easily implemented by controlling the accuracy of the manufacturing process of the micro-fluid channel. For example, a high-resolution pattern of a quantum dot light-emitting layer can be achieved, and the film thickness thereof can be accurately controlled by fixing and limiting the volume of the micro-fluid channel. Thus, the present disclosure can help implement uniform coating of the quantum dot light-emitting layer with a high resolution and reduce the process difficulty of a high-resolution product, and improve the performance of devices and the display performance.

Optionally, forming the micro-fluid channel on the first surface of the first substrate includes: forming a barrier layer on the first surface, wherein the barrier layer includes at least two spaced barrier strips extending in the same direction; and pressing a second substrate on the barrier layer to form the micro-fluid channel between the adjacent two barrier strips.

By manufacturing the barrier layer with this method, the size of the micro-fluid channel is easy to control, and thereby a pattern of the first film layer with a high-precision can be manufactured.

Optionally, after forming the barrier layer on the first surface and prior to pressing the second substrate on the barrier layer, the method further includes: performing surface treatment on the barrier layer to enable top surfaces of the at least two barrier strips to be flat surfaces within the same plane, such that the barrier layer can well fit the surface of the second substrate to form the micro-fluid channel.

Optionally, the surface which is pressed with the barrier layer, of the second substrate is configured as a hydrophobic surface, to help reduce the binding force between a formed film layer and the surface, such that the film layer is separated from the second substrate more easily.

Optionally, after drying the ink filling the micro-fluid channel, the method further includes: separating the first substrate from the second substrate.

Optionally, after separating the first substrate from the second substrate, the method further includes: removing the barrier layer on the first substrate.

Since the first substrate and the second substrate are separated and the barrier layer on the first substrate is removed, the obtained thin film can be continuously processed subsequently, or a film layer can be subsequently manufactured on the thin film.

Optionally, the further includes: selectively etching the thin film after forming the thin film, to enable the thin film to have at least one of the following features of an expected thickness and an expected pattern. A film layer structure that meets the requirement is obtained by etching the thin film.

The coating method shown in FIG. 1 may be applied to the process of manufacturing a display substrate. That is, during manufacture of a display substrate, a first film layer of the display substrate may be manufactured by the coating method shown in FIG. 1. Here, the display substrate may be a display substrate in a QLED or an OLED.

Manufacturing the first film layer of the display substrate by the above-described coating method may include: providing a first substrate on which the first film layer is to be manufactured; forming a micro-fluid channel on the first surface of the first substrate, wherein the first surface is a surface on which the first film layer is to be manufactured, and a sidewall of the micro-fluid channel is the first surface of the first substrate; immersing one end of the micro-fluid channel into ink to enable the ink to fill the micro-fluid channel; and drying the ink filling the micro-fluid channel to form the first film layer on the first surface of the first substrate.

Here, the display substrate may be any one of a QLED display substrate and an OLED display substrate.

The first film layer includes but is not limited to a hole injection layer, a hole transport layer, an electron transport layer, an electron injection layer, a red light-emitting layer, a green light-emitting layer and a blue light-emitting layer.

The ink is quantum dot ink when a QLED display substrate is manufactured, and the ink is organic ink when an OLED display substrate is manufactured.

After the micro-fluid channel is filled with ink, cross-linking treatment may be performed on the ink in the micro-fluid channel. Through cross-linking treatment on the ink, the physical strength of the manufactured film layer can be improved, thereby improving the photoelectric property of the film layer.

During manufacture of the display substrate, after the first film layer is formed, the first film layer is selectively etched to enable the first film layer to have at least one of the following features: an expected thickness and an expected pattern.

Hereinafter, the manufacturing method of the display substrate will be described with reference to FIG. 2 by taking the manufacturing process of a quantum dot light-emitting layer (for example, a red light-emitting layer, a green light-emitting layer, or a blue light-emitting layer) in the QLED display substrate as an example.

Figure 2:
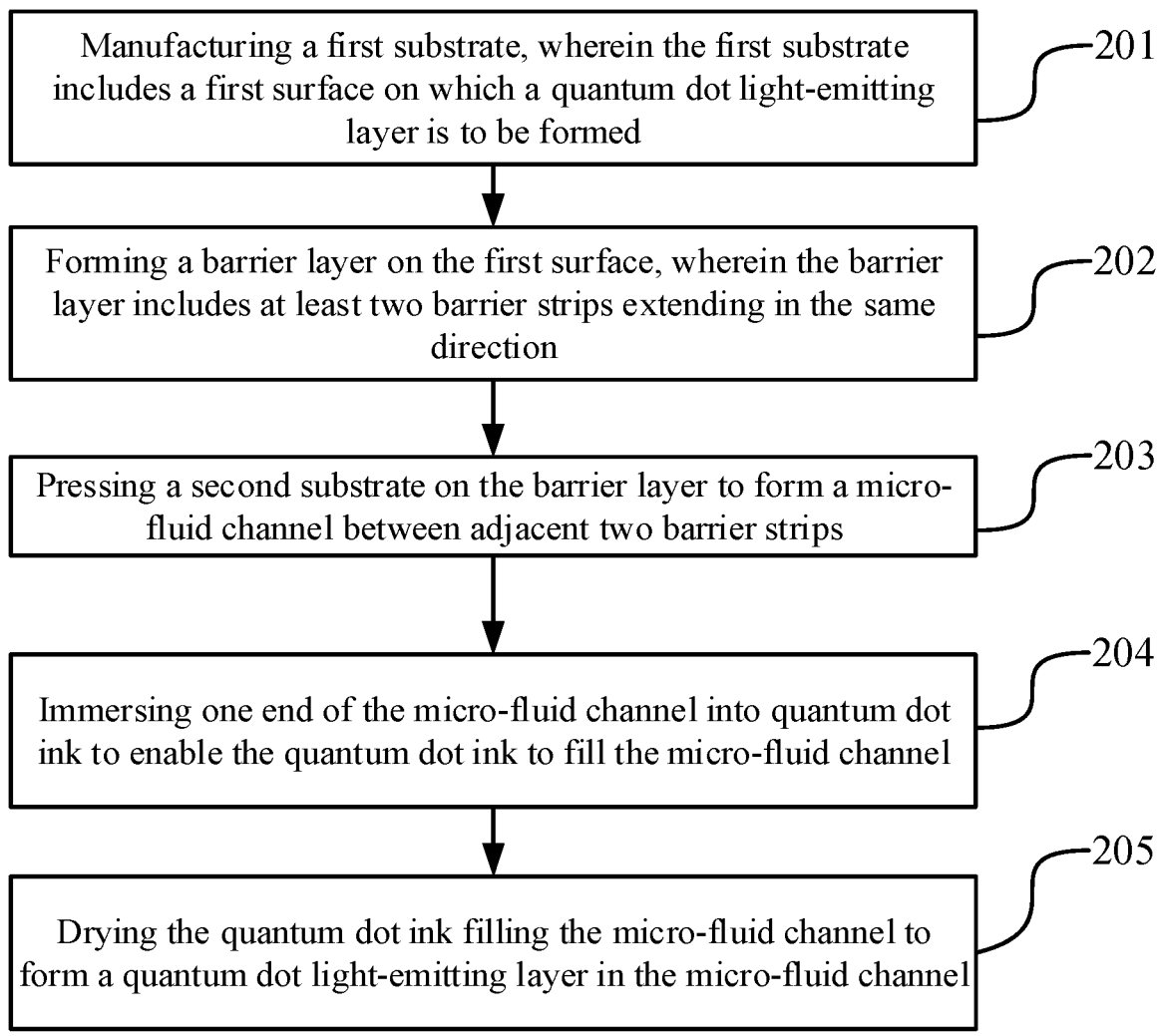
FIG. 2 is a flow chart showing a method of manufacturing a display substrate according to an embodiment of the present disclosure.

FIG. 2 is a flow chart of a manufacturing method of a display substrate according to an embodiment of the present disclosure. Referring to FIG. 2, the method includes following steps.

In step 201, a first substrate is manufactured, wherein the first substrate includes a first surface on which a quantum dot light-emitting layer is to be formed.

In step 202, a barrier layer is formed on the first surface, wherein the barrier layer includes at least two barrier strips extending in the same direction.

In step 203, a second substrate is pressed on the barrier layer to form a micro-fluid channel between adjacent two barrier strips.

In step 204, one end of the micro-fluid channel is immersed into quantum dot ink to enable the quantum dot ink to fill the micro-fluid channel.

In step 205, the quantum dot ink filling the micro-fluid channel is dried to form a quantum dot light-emitting layer in the micro-fluid channel.

Since a sidewall of the micro-fluid channel is the first surface of the first substrate, the quantum dot light-emitting layer is formed on the first surface of the first substrate.

It can be known from the above technical solution that the micro-fluid channel is formed by pressing the second substrate on the barrier layer of the first substrate and the quantum dot light-emitting layer formed in the micro-fluid channel by filling and drying can be shaped based on the size and the volume of the micro-fluid channel. Thus, a high-resolution pattern of the quantum dot light-emitting layer can be easily realized by controlling the accuracy of the manufacturing process of the barrier layer, and the film thickness thereof can be accurately controlled by the fixing and limiting the volume of the micro-fluid channel. Thus, the present disclosure can help implementing uniform film formation of the quantum dot light-emitting layer at a high resolution, reduce the process difficulty of a high-resolution product and improve the device performance and the display performance.

It should be noted that the display substrate may be a substrate structure including a quantum dot light-emitting layer in any kind of display device, and it may also be a display panel, an active matrix substrate, a touch panel, a display touch panel, an array substrate, a color filter, or an intermediate product (for example, a product motherboard that can be cut to obtain a plurality of product) in the production process of any of the above product. The quantum dot light-emitting layer may be, for example, a single-color light-emitting layer in a QLED display panel. The quantum dot light-emitting layer may also be, for example, a film layer needed to be further processed in an intermediate product which is not completely manufactured, and may not be limited thereto.

It should be appreciated that the first substrate may be, for example, a display substrate in an uncompleted state, on which the quantum dot light-emitting layer is to be manufactured during the manufacturing process of the display substrate, and the first surface refers to the surface, on which the quantum dot light-emitting layer is to be formed, of the first substrate. The first surface may be, for example, the entire upper surface of the first substrate or a surface in an active display region of the first substrate.

In an example, the barrier layer may be formed with organic polymer material by a patterning process. For example, the process for forming the barrier layer may include: depositing an organic polymer material layer; coating a photoresist layer on the organic polymer material layer; removing, by means of exposure and developing, the photoresist layer on a surface to be etched; removing, by means of dry etching or wet etching, the organic polymer material layer on and under the surface to be etched; and stripping off the residual photoresist layer, such that the organic polymer material layer that is not removed present as at least two strip-shaped bulges extending in the same direction. That is, a pattern including at least two barrier strips is formed.

In an example, the at least two barrier strips extending in the same direction in the barrier layer may be sequentially arranged in the same direction. The bottom of each barrier strip is combined with the surface of the first substrate. The top surface of each barrier strip is in a shape that fits the pressing surface of the second substrate. Thus, when the second substrate is pressed on the barrier layer, the top surface of each barrier strip fits the pressing surface of the second substrate. The side surfaces, facing each other, of the adjacent two barrier strips, and the surface the second substrate and the surface of the first substrate that face each other enclose a micro-fluid channel.

In an example, the shape and the size of the micro-fluid channel can be pre-configured based on requirement by designing a pattern of the barrier layer. The surface characteristics of the inner surface of the micro-fluid channel are all pre-configured through the forming materials and relevant parameters of the first substrate, the second substrate and the barrier layer, such that the micro-fluid channel can be filled with the quantum dot ink with liquidity in an expected manner under the action of capillary force when one end of the micro-fluid channel is immersed into quantum dot ink. For the convenience of filling the micro-fluid channel with quantum dot ink, the micro-fluid channel may be inclined by a certain angle when one end of the micro-fluid channel is immersed in the quantum dot ink. In order to prevent bubbles from being mixed with the quantum dot ink, the quantum dot ink may be degassed in advance, and deforming treatments, such as exertion of pressure pulse, atmospheric change of air pressure or hydraulic pressure and bubble dissolution may also be performed after the micro-fluid channel is filled with the quantum dot ink. By degassing the quantum dot ink, the problem that bubbles block the flow of ink in the micro-fluid channel to cause nonuniform coverage of ink is avoided, and comprehensive coverage of the thin film finally manufactured is guaranteed.

It should be appreciated that quantum dot ink refers to fluid which can form an expected solid quantum dot light-emitting material after being dried and it may not include an additive that affects transport of internal carriers or liquidity. After the quantum dot ink fills the micro-fluid channel, an operation, for example, cross-linking treatment (before or after drying or simultaneously with drying) can be performed on the quantum dot ink filling the micro-fluid channel. In an example, before drying, an additive for cross-linking may be added into the quantum dot ink filling the micro-fluid channel, and drying is performed after a full reaction. Taking this as an example, for other substances needed to be added into the quantum dot ink or other treatment needed to be performed the on the quantum dot ink, operations may be performed in due course after the micro-fluid channel is filled with the quantum dot ink. It should be understood that treatment on the quantum dot ink in all the micro-fluid channels may be processed simultaneously or separately, and can be set according to actual application requirements within a possible range.

It should be understood that for the display substrate to be manufactured, the second substrate and/or the barrier layer may be unnecessary. Therefore, after formation of the quantum dot light-emitting layer, the first substrate and the second substrate may be separated, and/or the barrier layer on the first substrate may be removed. In an example, the surface which is pressed with the first substrate, of the second substrate may be configured as a surface presenting hydrophobicity to the quantum dot ink, which may help reduce the binding force between the formed quantum dot light-emitting layer and the surface. Thus, the quantum dot light-emitting layer may be separated from the second substrate more easily.

It should also be understood that the dimensions (for example, thickness and/or pattern area) of the quantum dot light-emitting layer obtained after drying may be greater than those of a quantum dot light-emitting layer expected to be manufactured. That is, the dimensions of the micro-fluid channel may be designed to be greater than those of the quantum dot light-emitting layer required to be finally manufactured intentionally in advance. Then, the quantum dot light-emitting layer formed by drying is selectively etched, to remove part of the quantum dot light-emitting layer such that the quantum dot light-emitting layer has the expected thickness and/or pattern. For example, when the quantum dot light-emitting layer is manufactured by the micro-fluid channels, the parts of the quantum dot light-emitting layer corresponding to one column of sub-pixels are connected. In this case, connected portions of the quantum dot light-emitting layers between the sub-pixels are removed by a patterning process, to avoid influence among the sub-pixels during light emitting.

It can be seen that since the micro-fluid channel is formed by pressing the second substrate on the barrier layer of the first substrate, and the quantum dot light-emitting layer formed in the micro-fluid channel by filling and drying may be shaped in accordance with the size and the volume of the micro-fluid channel, a high-solution pattern of the quantum dot light-emitting layer can be easily achieved by controlling the accuracy of the manufacturing process of the barrier layer, and the film thickness thereof can be accurately controlled by the fixing and limiting volume of the micro-fluid channel. Thus, the embodiments of the present disclosure can help realize uniform film formation of the quantum dot light-emitting layer at a high resolution, reduce the process difficulty of a high-resolution product and improve the device performance and the display performance.

FIG. 3 to FIG. 6 are schematic diagrams of a manufacturing process of a quantum dot light-emitting layer according to an embodiment of the present disclosure. In the present embodiment, the manufacturing method of the display substrate includes the following processes.

Manufacture of a first substrate: in the embodiment, the first substrate is an array back plate of a Thin Film Transistor (TFT) of a quantum dot light-emitting display device. As an example, the manufacturing process includes the followings. After a transparent substrate is cleaned and dried, a metal film layer is deposited on the transparent substrate and patterning is performed, to form a pattern of a gate metal layer (for example, the gate metal layer is made from Mo and has a thickness of 200 nm). Then, a gate insulating layer (for example, the gate insulating layer is made from $SiO_2$ and has a thickness of 150 nm) covering the gate metal layer and the transparent substrate is formed. A semiconductor film layer is deposited on the gate insulating layer and patterning is performed, to form a pattern of an active layer (for example, the active layer is made from an indium gallium zinc oxide (IGZO) and has a thickness of 40 nm). A metal film layer is deposited on the gate insulating layer and the active layer and patterning is performed, to form a pattern of a source/drain metal layer (for example, the source/drain material layer is made from Mo and has a thickness of 200 nm). Then, a passivation layer (for example, the passivation layer is made from $SiO_2$ and has a thickness of 300 nm) covering the gate insulating layer, the active layer and the source/drain metal layer is formed, and a connection via hole is formed in the passivation layer through patterning. Afterwards, a transparent conductive film layer is deposited on the passivation layer and patterning is performed, to form a pattern of a pixel electrode layer (for example, the pixel electrode layer is made from indium tin oxide and has a thickness of 40 nm).

As an example, the first substrate includes sub-pixel regions of a first color, sub-pixel regions of a second color and sub-pixel regions of a third color. All the sub-pixel regions are arranged in multiple rows and columns. Here, the sub-pixel regions in each sub-pixel column are of the same color. The sub-pixel column of the first color, the sub-pixel column of the second color and the sub-pixel column of the third color are periodically arranged. Thus, since quantum dot light-emitting layer of different colors need to be adopted in the sub-pixel regions of different colors, the quantum dot light-emitting layer of each color can be sequentially manufactured by the above-described forming method of the quantum dot light-emitting layer. The manufacturing process of the quantum dot light-emitting layer of each color will be described below by taking the manufacturing process of the quantum dot light-emitting layer of the first color as an example.

Figure 3:
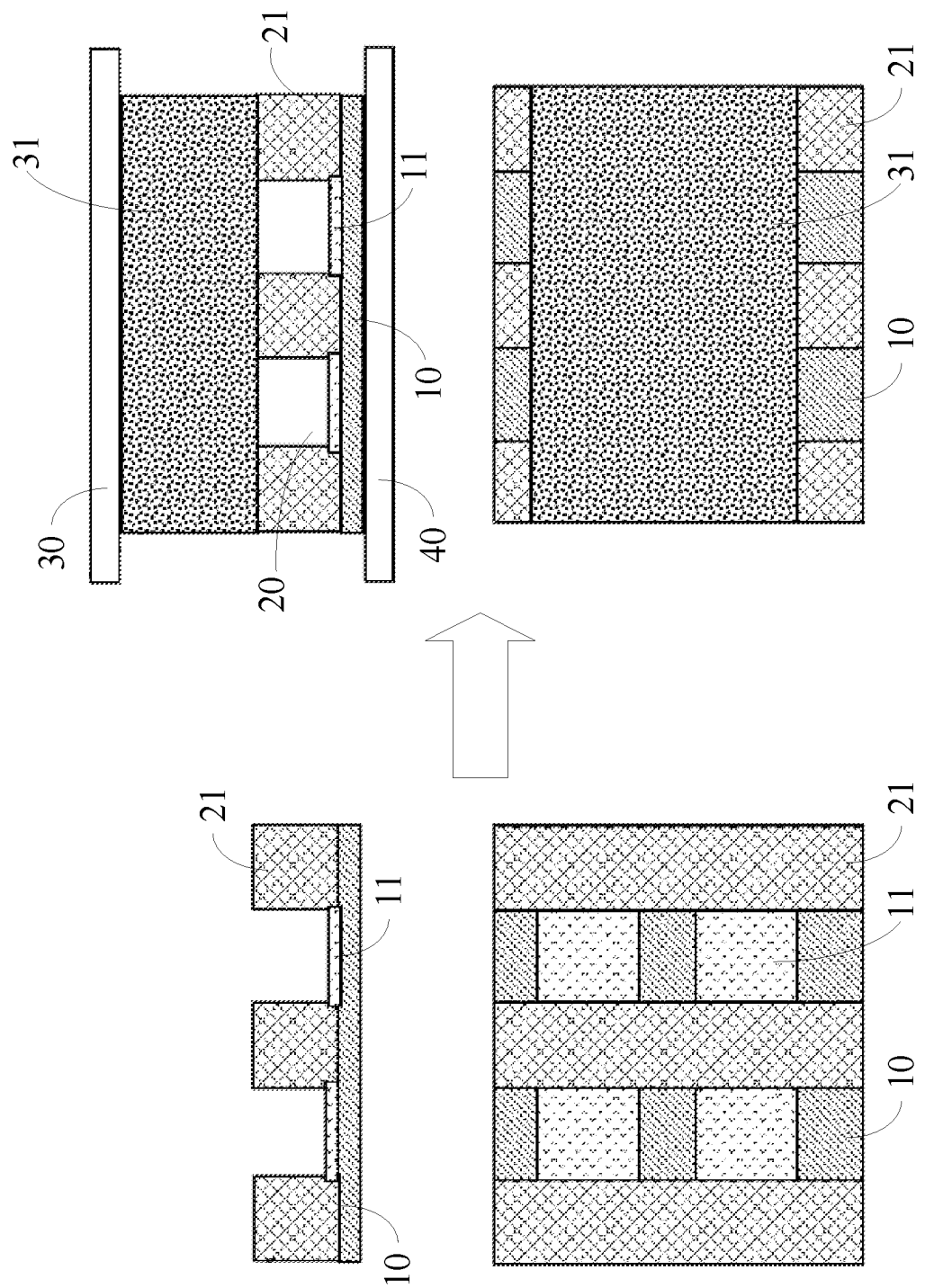
FIG. 3 to FIG. 6 are schematic diagrams showing a process of manufacturing a quantum dot light-emitting layer according to an embodiment of the present disclosure.

Manufacture of a barrier layer: the manufactured first substrate includes a plurality of sub-pixel columns of the first color formed by arranging the sub-pixel regions of the first color, and each sub-pixel region includes one pixel electrode. Thus, the quantum dot light-emitting layer to be formed needs to cover each sub-pixel column of the first color, and a first surface, on which the quantum dot light-emitting layer is to be formed, of the first substrate includes an upper surface of each pixel electrode. On the first surface, for example, an acrylic material may be adopted as the organic polymer material to form a pattern including at least two barrier strips, that is the barrier layer which may also be referred to as a pixel definition layer. The height of the barrier layer may be about 2 In addition to be cuboid, the barrier layer may adopt the structure of a frustum of a prism. That is, the side edge of each barrier strip may have a certain slant angle, for example 60 degrees, to facilitate manufacture. The side view (upper left of FIG. 3) and the top view (lower left of FIG. 3) of the first substrate with the barrier layer formed on the first surface are shown on the left side of FIG. 3. As shown in FIG. 3, on the first substrate 10, each sub-pixel column of the first color (the sub-pixel column on which pixel electrodes 11 corresponding to the sub-pixel regions of the first color are formed, and pixel electrodes 11 in the sub-pixel regions of other colors are not shown) is between adjacent two barrier strips 21, and the region between every two adjacent sub-pixel columns of the first color is covered by one barrier strip 21. It should be appreciated that each barrier strip 21 covers the sub-pixel columns of other colors, such as the sub-pixel column of the second color and the sub-pixel column of the third color, between the two adjacent sub-pixel columns of the first color. Thus, in the subsequent processes, the quantum dot light-emitting layer of the first color will not be formed in the sub-pixel regions of other colors. Similarly, during the manufacturing process of the quantum dot light-emitting layer of other colors, the same method may be adopted to cover the sub-pixel column in which the quantum dot light-emitting layer has been formed or has not been formed, such that the quantum dot light-emitting layer of different colors may be formed on the first substrate one by one.

Pressing of a second substrate: the side view (upper right of FIG. 3) and the top view (lower right of FIG. 3) of the first substrate which is pressed with the second substrate are shown on the right side of FIG. 3. As shown in FIG. 3, the second substrate 30 may be, for example, an upper clamp plate of a clamping tool in a pressing mechanism, and a lower clamp plate 40 of the clamping tool may be configured to place the first substrate 10. Elastic colloid 31 (for example, a PDMS coating layer) with an even surface is disposed on the second substrate 30 in advance, to provide a surface to be pressed with the first substrate 10. Before pressing, surface treatment can be performed on the barrier layer by means of, for example, plasma bombardment, to enable top surfaces of the at least two barrier strips 21 to be flat surfaces within the same plane, such that the barrier layer can well fit the surface of the elastic colloid 31 on the second substrate 30. During pressing, the first surface, on which the barrier layer is formed, of the first substrate 10 may be upwardly placed on the lower clamp plate 40 of the clamping tool, and then the pressing mechanism is used to press the second substrate 30 serving as the upper clamp plate to the first substrate 10 placed on the lower clamp plate 40, such that one micro-fluid channel 20 (the upper surface is the lower surface of the elastic colloid 31 and the lower surface is the upper surface, including the surface of the pixel electrode 11, of the first substrate 10) is formed between every two adjacent barrier strips 21.

Figure 4:
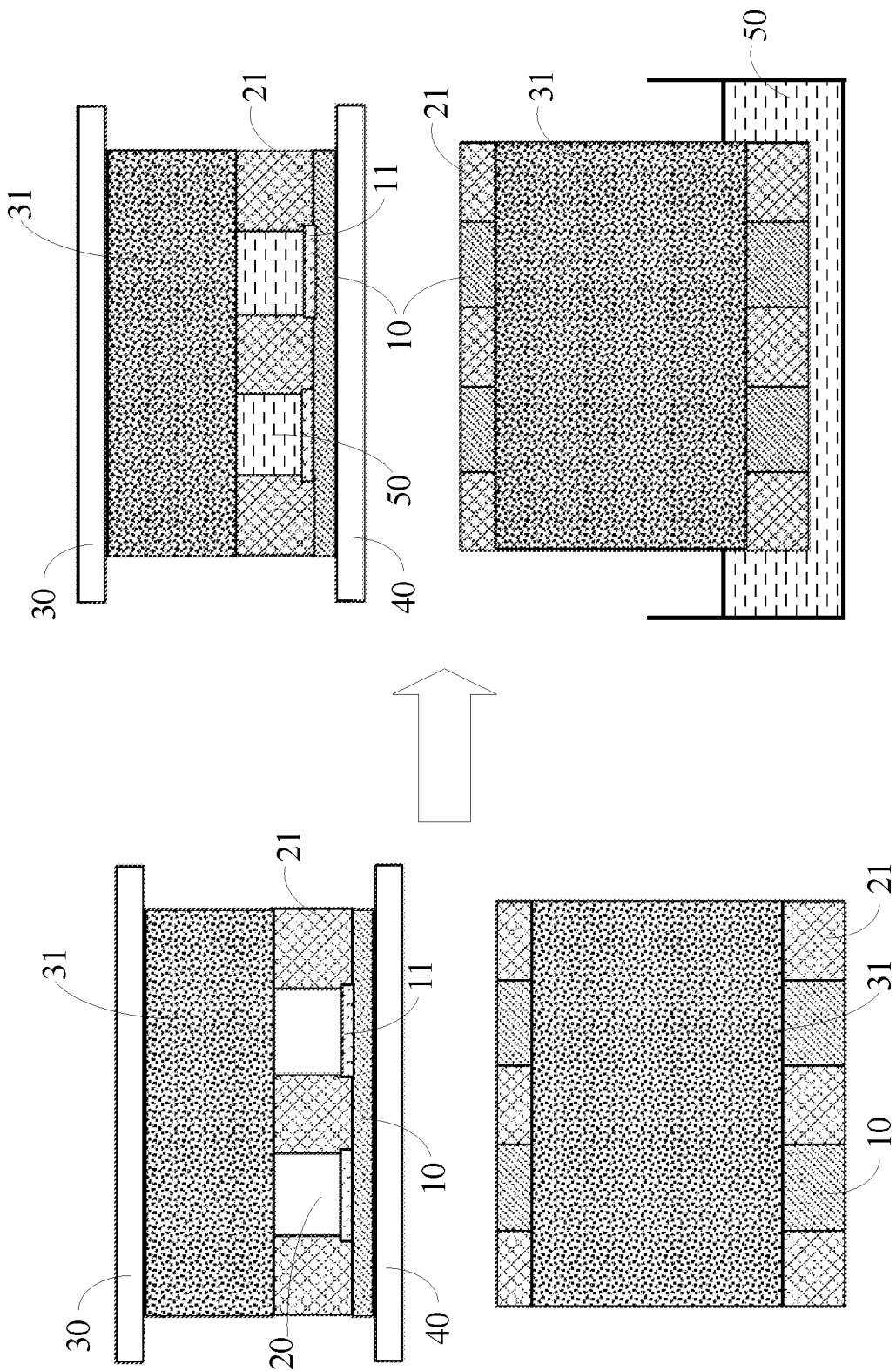

Filling of quantum dot ink: FIG. 4 shows a state change of the first substrate from pressing with the second substrate to immersion of one end of the micro-fluid channel into the quantum dot ink. As shown in FIG. 4, the whole clamping tool is controlled to rotate by a certain angle and then is moved into a liquid bath with the quantum dot ink 50 under the circumstance that the second substrate 30 serving as the upper clamp plate and the first substrate 10 placed on the lower clamp plate 40 maintain pressed with each other, such that one end of each micro-fluid channel can be immersed below the liquid level of the quantum dot ink 50. Thus, the quantum dot ink 50 in the liquid bath gradually fills the micro-fluid channel from bottom to top under the action of capillary force to complete filling.

Figure 5:
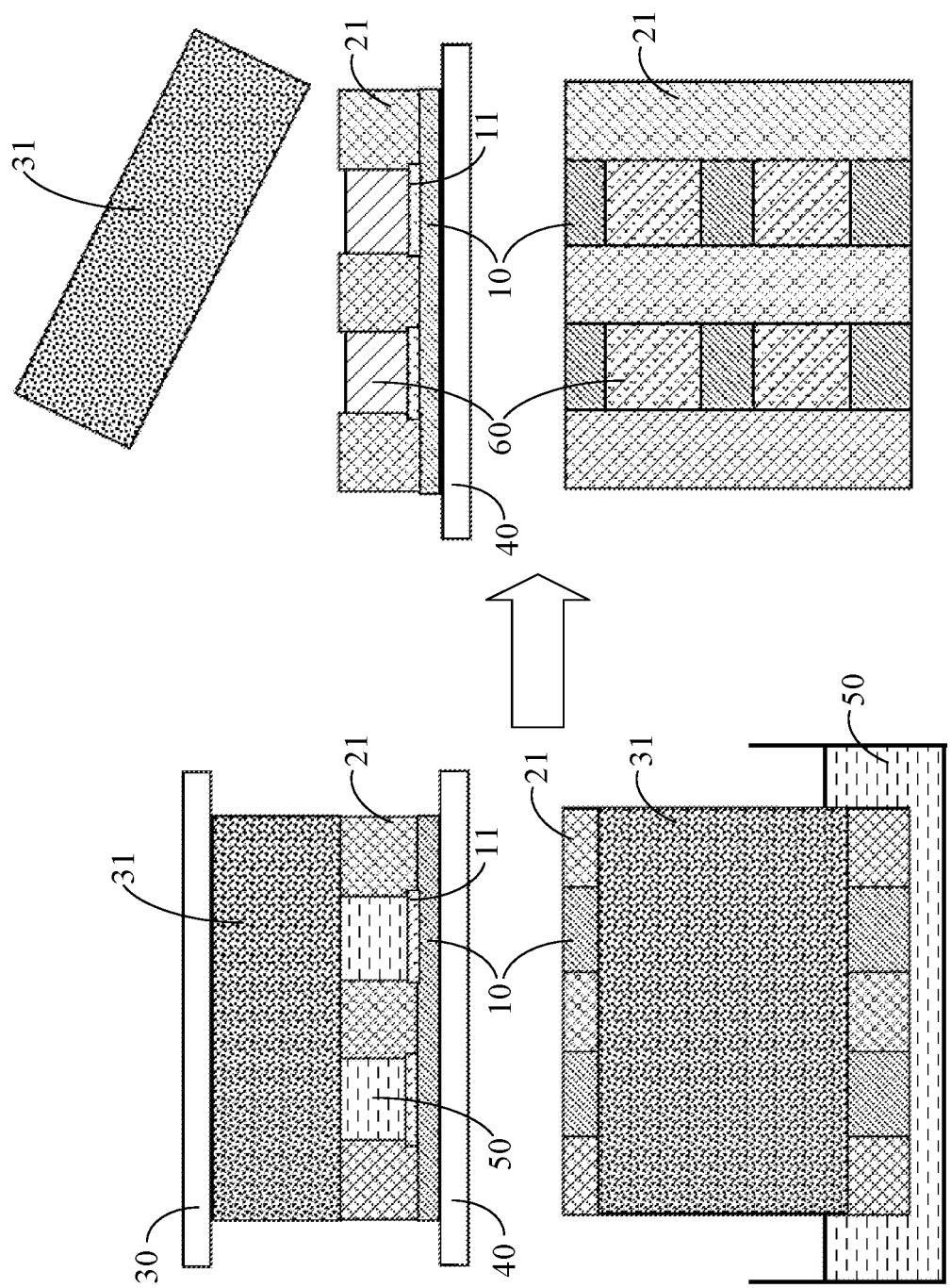

Drying of the quantum dot ink: FIG. 5 shows a state change of the first substrate from immersion of one end of the micro-fluid channel into the quantum dot ink to finish of drying of the quantum dot ink. As shown in FIG. 5, the clamping tool is controlled to rotate back to be in a horizontal state and then is moved out of the liquid bath under the circumstance that the second substrate 30 serving as the upper clamp plate and the first substrate 10 placed on the lower clamp plate 40 maintain pressed with each other. In this case, the quantum dot ink 50 can be retained in the micro-fluid channel under the action of the capillary force. Then, the first substrate 10 and the second substrate 30 can be heated by means of, for example, thermal radiation drying, such that the quantum dot ink 50 in the micro-fluid channel may be dried and undergo cross-linking reaction simultaneously, to form a quantum dot light-emitting layer 60 of a first color through curing. It should be understood that a cross-linking agent may be added to cross-link the quantum dot ink 50 by way of cooperating or replacing thermal radiation drying. Also, the way of drying may be heat conduction or heat convection. Drying and cross-linking can be respectively performed successively, and may be not limited thereto. Separation of the first substrate from the second substrate: FIG. 5 shows a state change of the first substrate from immersion of one end of the micro-fluid channel into the quantum dot ink to finish of separation from the second substrate. As shown in FIG. 5, after formation of the quantum dot light-emitting layer 60 of the first color, pressure between the two clamp plates of the clamping tool can be removed in a horizontal state. Then, a cutter may be utilized to cut out a small opening between the elastic colloid 31 and the barrier strip 21 at the outermost edge. Afterwards, the elastic colloid 31 is gradually torn off from the first substrate 10 from the small opening. Certainly, the method for separating the first substrate from the second substrate may not be limited to the above example.

Figure 6:
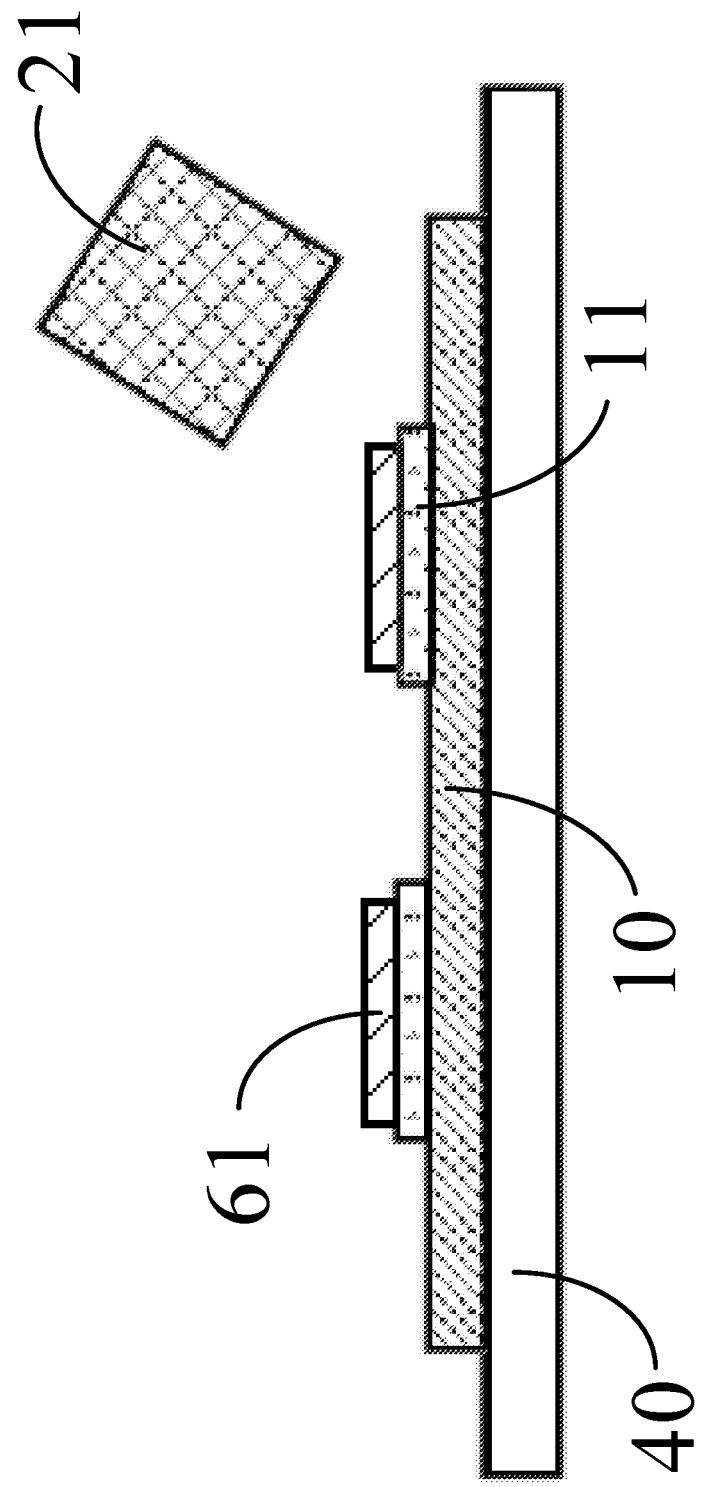

Post-processing: after separating the first substrate from the second substrate, the barrier layer may be stripped off the first substrate 10, to facilitate subsequent processing and manufacture. FIG. 6 shows the structure of the first substrate obtained by selectively etching the entire first substrate to integrally thin the quantum dot light-emitting layer 60 of the first color on the whole after the barrier strip 21 of the barrier layer is stripped off the first substrate 10. As shown in FIG. 6, a patterned quantum dot light-emitting layer 61 that covers the sub-pixel columns of the first color is formed on the processed first substrate 10. After that, on this basis, quantum dot light-emitting layer of other colors can be manufactured according to the above process.

Since the quantum dot light-emitting layer is of different colors, they need to be manufactured according to their colors. For example, the red quantum dot light-emitting layer, the green quantum dot light-emitting layer and the blue quantum dot light-emitting layer are manufactured respectively. However, for the hole injection layer, the hole transport layer, the electron injection layer and the electron transport layer, each of the layers is manufactured once without distinguishing the colors. The hole injection layer and the hole transport layer are manufactured before manufacture of the quantum dot light-emitting layer, and the electron injection layer and the electron transport layer are manufactured after manufacture of the quantum dot light-emitting layer.

After manufacture of the electron injection layer and the electron transport layer, a cathode layer is manufactured. The cathode layer may be made from LiF:Al materials by evaporation. After manufacture of the cathode layer, an encapsulation layer is manufactured. The encapsulation layer may be made from Indium Zinc Oxide (IZO) by sputtering. Since the IZO is electrically conductive, the encapsulation layer can protect the cathode layer on one hand, and play a role of electrical conduction together with the cathode layer on the other hand, which may enhance the electrical conduction effect of the cathode layer. The required display substrate is finally formed in accordance with the above manufacturing solution.

Based on the same inventive concept, an embodiment of the present disclosure provides a display substrate, which is obtained by any of the above manufacturing methods of the display substrate.

Based on the same inventive concept, an embodiment of the present disclosure provides a display device including a display substrate obtained by any of the above manufacturing methods of the display substrate. The display device provided in the embodiment of the present disclosure may be any product or component with a display function, such as a display panel, a mobile phone, a tablet PC, a television, a display, a laptop computer, a digital photo frame or a navigator.

Figure 7:
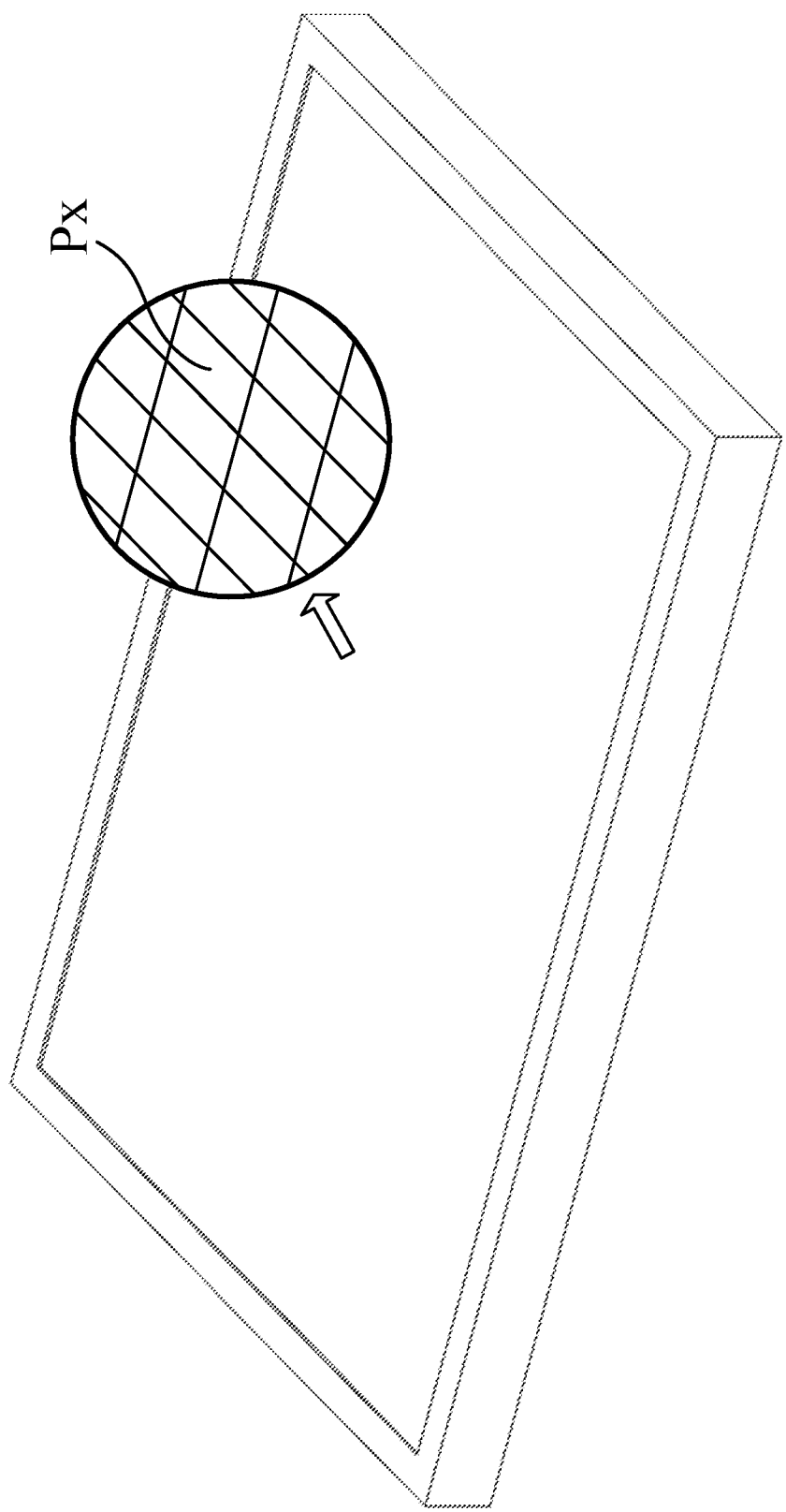
FIG. 7 is a schematic structural diagram of a display device according to an embodiment of the present disclosure.

In an example, as shown in FIG. 7, the display device includes sub-pixel units Px arranged in rows and columns in the display region. A quantum dot light-emitting layer formed by any of the above methods is formed in each sub-pixel unit Px. The embodiments of the present disclosure may help implement uniform film formation of the quantum dot light-emitting layer at a high resolution, reduce the process difficulty of a high-resolution product and improve the device performance and the display performance.

The foregoing descriptions are merely embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A coating method, comprising:
    forming a micro-fluid channel on a first surface of a first substrate, wherein the first surface is a surface to be coated of the first substrate, the micro-fluid channel is a straight two-end channel formed by pressing a second substrate on the first substrate, and a sidewall of the micro-fluid channel is the first surface of the first substrate;
    immersing one end of the micro-fluid channel into ink to enable the ink to fill the micro-fluid channel under action of capillary force overcoming gravity of the ink; and
    drying the ink filling the micro-fluid channel to form a thin film on the first surface of the first substrate.

2. The method according to claim 1, wherein forming the micro-fluid channel on the first surface of the first substrate comprises:
    forming a barrier layer on the first surface, wherein the barrier layer comprises at least two spaced barrier strips extending in the same direction; and
    pressing a second substrate on the barrier layer to form a micro-fluid channel between adjacent two of the barrier strips.

3. The method according to claim 2, wherein after forming the barrier layer on the first surface and prior to pressing the second substrate on the barrier layer, the method further comprises:
    performing surface treatment on the barrier layer to enable top surfaces of the at least two barrier strips to be flat surfaces within a same plane.

4. The method according to claim 2, wherein a surface which is pressed with the barrier layer, of the second substrate is configured as a hydrophobic surface.

5. The method according to claim 2, wherein after drying the ink filling the micro-fluid channel, the method further comprises:
    separating the first substrate from the second substrate.

6. The method according to claim 5, wherein after separating the first substrate from the second substrate, the method further comprises:
    removing the barrier layer on the first substrate.

7. The method according to claim 1, wherein prior to immersing one end of the micro-fluid channel into the ink, the method further comprises:
    degassing the ink.

8. The method according to claim 1, wherein after the ink fills the micro-fluid channel, the method further comprises:
    performing cross-linking treatment on the ink in the micro-fluid channel.

9. The method according to claim 1, further comprising:
    selectively etching the thin film after forming the thin film, to enable the thin film to have at least one of the following features of an expected thickness and an expected pattern.

10. A manufacturing method of a display substrate, comprising manufacturing a first film layer of the display substrate in the following manner:

providing a first substrate on which the first film layer is to be manufactured;

forming a micro-fluid channel on a first surface of the first substrate, wherein the first surface is a surface on which the first film layer is to be manufactured, the micro-fluid channel is a straight two-end channel formed by pressing a second substrate on the first substrate, and a sidewall of the micro-fluid channel is the first surface of the first substrate;

immersing one end of the micro-fluid channel into ink to enable the ink to fill the micro-fluid channel under action of capillary force overcoming gravity of the ink; and drying the ink filling the micro-fluid channel to form the first film layer on the first surface of the first substrate.

11. The method according to claim 10, wherein forming the micro-fluid channel on the first surface of the first substrate comprises:

forming a barrier layer on the first surface, wherein the barrier layer comprises at least two spaced barrier strips extending in the same direction; and pressing a second substrate on the barrier layer to form the micro-fluid channel between adjacent two of the barrier strips.

12. The method according to claim 11, wherein after forming the barrier layer on the first surface and prior to pressing the second substrate on the barrier layer, the method further comprises:

performing surface treatment on the barrier layer to enable top surfaces of the at least two barrier strips to be flat surfaces within a same plane.

13. The method according to claim 11, wherein a surface which is pressed with the barrier layer, of the second substrate is configured as a hydrophobic surface.

14. The method according to claim 10, wherein after the fills the micro-fluid channel, the method further comprises:

performing cross-linking treatment on the ink in the micro-fluid channel.

15. The method according to claim 10, wherein the first substrate comprises a plurality of sub-pixel columns formed by sub-pixel regions of a first color, and forming the barrier layer on the first surface comprises:

forming a pattern including the at least two barrier strips on the first surface, to enable each of the sub-pixel regions of the first color to be between adjacent two of the barrier strips, and a region between every adjacent two of the sub-pixel columns is covered by one of the barrier strips respectively.

16. The method according to claim 15, wherein providing the first substrate on which the first film layer is to be manufactured comprises:

forming a pattern including a pixel electrode layer, wherein the pixel electrode layer comprises one pixel electrode in each of the sub-pixel regions of the first color.

17. The method according to claim 10, wherein the display substrate is any one of a Quantum Dot Light-emitting Diode display substrate and an Organic Light-emitting Diode display substrate.

18. The method according to claim 10, wherein the first film layer is any one of the following film layers in the display substrate: a hole injection layer, a hole transport layer, an electron transport layer, an electron injection layer, a red light-emitting layer, a green light-emitting layer and a blue light-emitting layer.

* * * * *